United States Patent
Leobandung et al.

(10) Patent No.: US 9,640,442 B2
(45) Date of Patent: May 2, 2017

(54) CMOS FIN INTEGRATION ON SOI SUBSTRATE

(71) Applicant: INTERNATIONAL BUSINESS MACHINES CORPORATION, Armonk, NY (US)

(72) Inventors: Effendi Leobandung, Stormville, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/058,865

(22) Filed: Mar. 2, 2016

(65) Prior Publication Data
US 2017/0011969 A1    Jan. 12, 2017

Related U.S. Application Data (63) Continuation of application No. 14/794,562, filed on Jul. 8, 2015, now Pat. No. 9,330,984.

(51) Int. Cl.
| | | |
|---|---|---|
| *H01L 21/00* | (2006.01) | |
| *H01L 21/8238* | (2006.01) | |
| *H01L 21/84* | (2006.01) | |
| *H01L 21/02* | (2006.01) | |

(52) U.S. Cl.
CPC .......... *H01L 21/823821* (2013.01); *H01L 21/02532* (2013.01); *H01L 21/845* (2013.01)

(58) Field of Classification Search
CPC .......... H01L 27/0924; H01L 29/0657; H01L 21/823821; H01L 21/845; H01L 21/02532
See application file for complete search history.

(56) References Cited

U.S. PATENT DOCUMENTS

| | | | |
|---|---|---|---|
| 7,993,999 B2 | 8/2011 | Basker et al. | |
| 8,048,723 B2 | 11/2011 | Chang et al. | |
| 8,053,301 B2 | 11/2011 | Jaeger et al. | |
| 8,828,818 B1 | 9/2014 | Rodder | |
| 2012/0104509 A1* | 5/2012 | Matsumoto | H01L 21/82381 257/369 |
| 2014/0099774 A1 | 4/2014 | Vincent | |
| 2014/0170839 A1* | 6/2014 | Brunco | H01L 29/66795 438/479 |
| 2014/0264602 A1 | 9/2014 | Basker et al. | |
| 2014/0353760 A1 | 12/2014 | Loubet et al. | |
| 2015/0028454 A1 | 1/2015 | Cheng et al. | |

OTHER PUBLICATIONS

Cheng, K., et al., "High Performance Extremely Thin SOI (ETSOI) Hybrid CMOS with Si Channel NFET and Strained SiGe Channel PFET," IEEE International Electron Devices Meeting (IEDM), Dec. 2012. (pp. 1-4).
List of IBM Patents or Patent Applications Treated as Related dated Mar. 2, 2016, 2 pages.

* cited by examiner

*Primary Examiner* — Richard Booth
(74) *Attorney, Agent, or Firm* — Tutunjian & Bitetto, P.C.; Vazken Alexanian (57) ABSTRACT

A method for complementary metal oxide semiconductor (CMOS) fin integration includes recessing a fin structure buried in a dielectric fill to form a trench in the dielectric fill having a fin portion remaining at a bottom thereof. A new fin is epitaxially grown in the trench from the fin portion. The new fin included SiGe.

17 Claims, 7 Drawing Sheets

CMOS FIN INTEGRATION ON SOI SUBSTRATE

BACKGROUND

Technical Field

The present invention relates to semiconductor processing, and more particularly to devices and integration methods for different material fins on a same semiconductor-on-insulator substrate (SOI).

Description of the Related Art

Many semiconductor devices employ fin structures for the formation of the field effect transistors (finFETs). In conventional fin formation processes, a bulk silicon substrate is etched, and a SiGe layer is grown. Later, each portion is etched to form fins. N-type field effect transistors (NFETs) are formed in the silicon and P-type field effect transistors (PFETs) are formed in the SiGe material.

In some instances, the use of SiGe fins is advantageous due to improved mobility; however, SiGe structures formed epitaxially may be limited by critical thickness. For example, if the thickness of the epitaxial layer is kept small enough to maintain its elastic strain energy below an energy of dislocation formation (defects), the strained-layer structure will be thermodynamically stable against dislocation formation. To maintain a defect free epitaxial layer, the thickness of the layer is limited.

In SiGe, this critical thickness depends strongly on Ge concentration in the layer. In complementary metal oxide semiconductor (CMOS) processing, conventional methods include a Si fin being etched to leave only a 5-10 nm layer of Si on a PFET side. A SiGe layer is epitaxially grown on the Si layer. Since the critical thickness depends on the Ge content, only a 5-10 nm SiGe layer can be epitaxially grown in a blanket growth process that is fully strained without defects for a desired Ge concentration in the SiGe layer.

SUMMARY

A method for complementary metal oxide semiconductor (CMOS) fin integration includes forming fin structures from a semiconductor layer of a silicon-on-insulator substrate and filling between the fin structures with a dielectric fill. The fin structures are masked in a first area while leaving top portions of the fin structures in a second area exposed. The fin structures are recessed in the second area to form trenches, and each trench has a fin portion remaining at a bottom thereof. A new fin is epitaxially grown in the trench from the fin portion. The new fin includes SiGe.

Another method for complementary metal oxide semiconductor (CMOS) fin integration includes forming fin structures from a silicon layer of a silicon-on-insulator substrate; forming a dielectric fill between the fin structures; exposing top portions of the fin structures by removing a portion of the dielectric fill; designating an N-type field effect transistor (NFET) region and P-type field effect transistor (PFET) region on the substrate; masking the NFET region; recessing the fin structures in the PFET region to form trenches within the dielectric fill, each trench having a silicon portion remaining at a bottom thereof; epitaxially growing a SiGe fin in the trench from the silicon portion and thermally mixing Ge from the SiGe fin into the silicon portion.

Yet another method for complementary metal oxide semiconductor (CMOS) fin integration includes forming fin structures from a silicon layer of a silicon-on-insulator substrate; forming a dielectric fill between the fin structures; exposing top portions of the fin structures by removing a portion of the dielectric fill; designating an N-type field effect transistor (NFET) region and P-type field effect transistor (PFET) region on the substrate; masking the NFET region; recessing the fin structures in the PFET region to form trenches within the dielectric fill, each trench having a silicon portion remaining at a bottom thereof; epitaxially growing a SiGe fin in the trench from the silicon portion, for which growth is independent of Ge concentration such that a Ge concentration of over 90 atomic % is provided and thermally mixing Ge from the SiGe fin into the silicon portion.

A method for complementary metal oxide semiconductor (CMOS) fin integration includes recessing a fin structure buried in a dielectric fill to form a trench in the dielectric fill having a fin portion remaining at a bottom thereof. A new fin is epitaxially grown in the trench from the fin portion. The new fin included SiGe.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods for forming SiGe fins with high Ge concentration and fewer limits on fin height are provided. In one embodiment, instead of blanket SiGe formation which is limited in thickness due to Ge concentration, the present principles reduce growth area by forming a trench. The trench is formed by first forming the fins, then burying the fins in dielectric material. Fins that are to be formed as SiGe fins are then recessed leaving a small portion at the bottom of the dielectric trench. An epitaxial growth process is employed to grow the SiGe fin without Ge concentration restrictions and with less thickness restrictions.

In contrast to the conventional blanket growth of SiGe which easily develops strain as limited by critical thickness, the SiGe fin grown in accordance with the present principles is grown in a narrow space. The strain related to SiGe growth is easily relieved in the narrow space, which lifts the critical thickness limitations experienced by the conventional process.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ (or $Si_{1-x}Ge_x$) where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
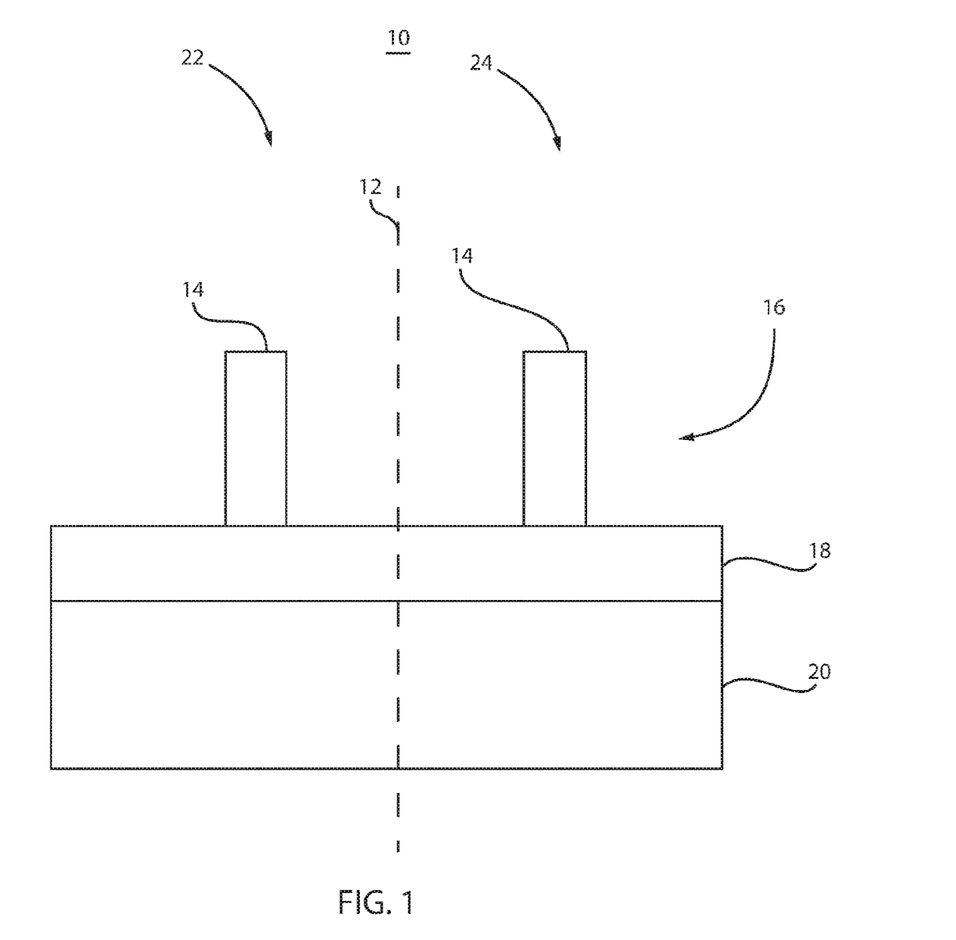
FIG. 1 is a cross-sectional view of a partially fabricated semiconductor device showing fins formed in a first area and a second area in accordance with the present principles.

Referring now to the drawings in which like numerals represent the same or similar elements and initially to FIG. 1, a partially fabricated semiconductor device 10 is illustratively shown in cross-section. Fins 14 (e.g., an array of parallel fins) are formed from a semiconductor material, such as, e.g., monocrystalline Si. The fins 14 may be patterned from a silicon layer 16 of a silicon-on-insulator (SOI) substrate (where substrate 12 includes a dielectric layer 18 on a base substrate 20). The dielectric layer 18 may include a buried oxide (BOX) or may include other dielectric material.

The fins 14 (or portions of fins) are split into regions, for separate processing of NFET regions 20 and PFET regions 22. A boundary 12 is depicted to indicate the separate regions for the formation of complementary metal oxide semiconductor (CMOS) devices. The fins 14 are formed by a lithographic patterning process and etched from the layer 16. It should be noted that the fins 14 are formed from a same material and etched together before formation of SiGe.

Conventional processing etches the silicon layer (leaving a 5-10 nm portion of the silicon behind) followed by blanket SiGe growth on the 5-10 nm silicon portion. Then, fins are formed by lithographic patterning.

Figure 2:
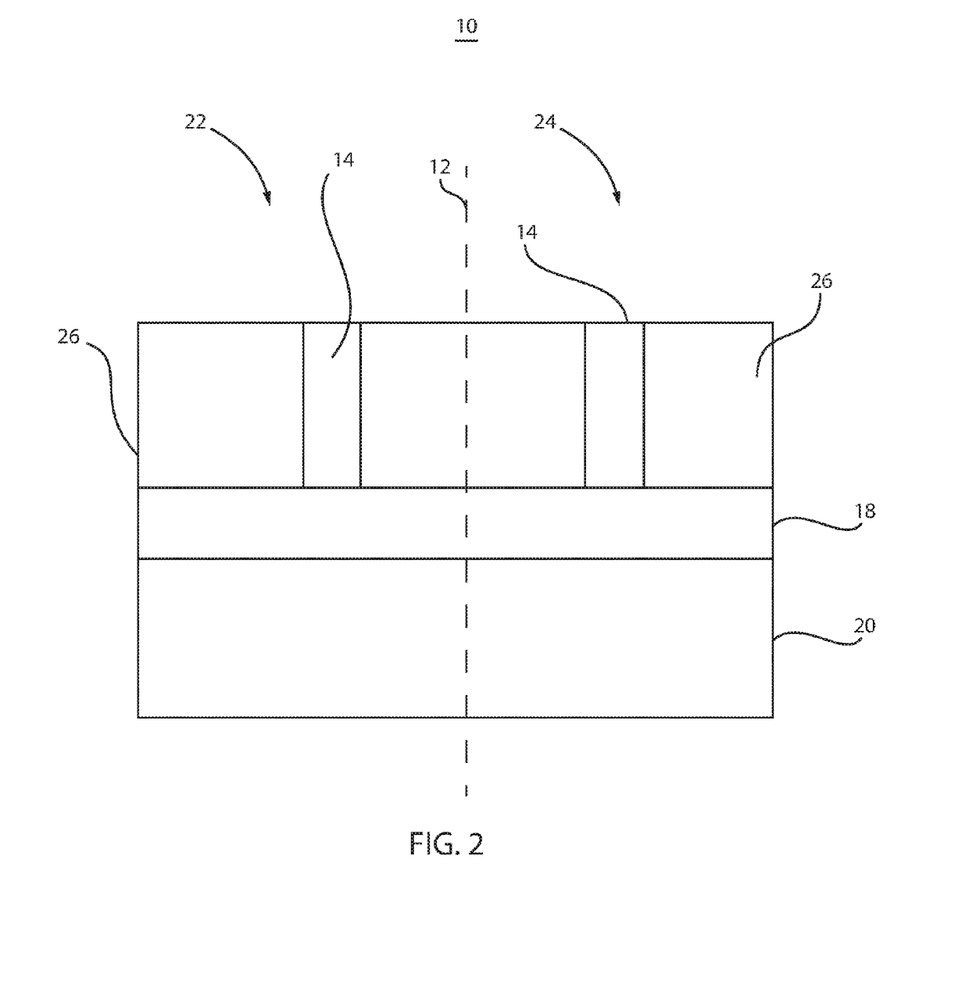
FIG. 2 is a cross-sectional view of the device of FIG. 1 showing a dielectric fill between the fins in accordance with the present principles.

Referring to FIG. 2, the fins 14 are buried in a dielectric material 26. The dielectric materials may include an oxide, such as a silicon oxide. The dielectric material 26 fills between fins 14. The deposition of the dielectric materials 26 may be performed by any known process, e.g., chemical vapor deposition (CVD), etc. The device 10 is then subjected to a recess process which may include an etch process or a chemical mechanical polish (CMP). The recess process leaves the fins 14 exposed through the dielectric material 26. An optical hard mask (not shown) can be installed on top of the fin as an etch mask and a CMP stop layer.

Figure 3:
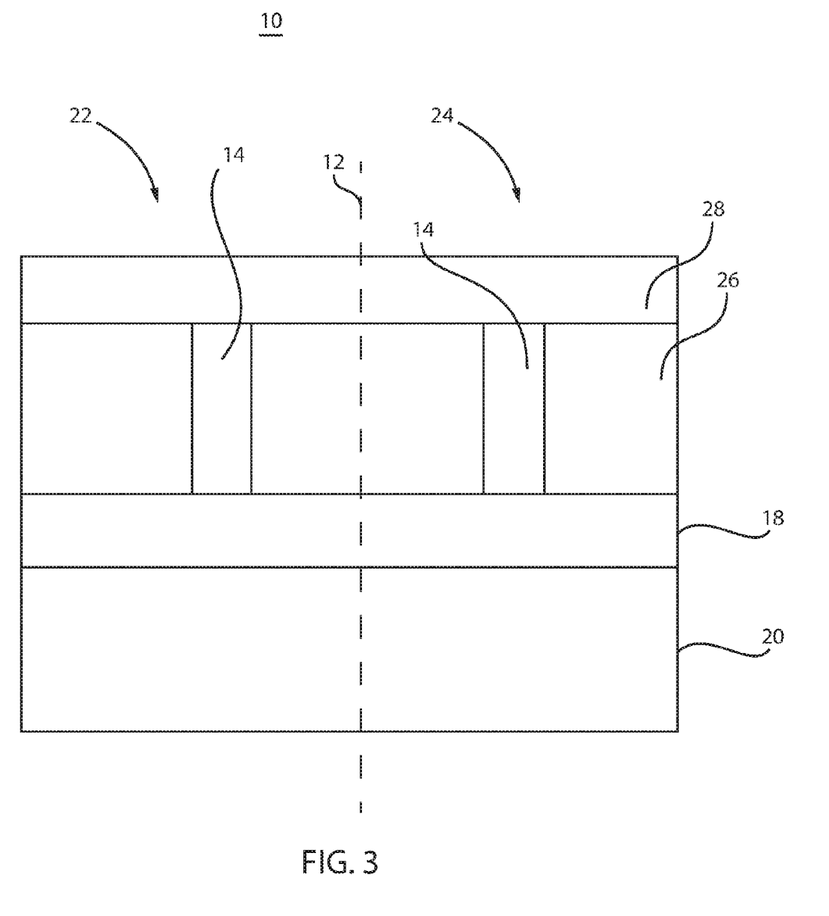
FIG. 3 is a cross-sectional view of the device of FIG. 2 showing a masking layer formed over the first and second areas in accordance with the present principles.

Referring to FIG. 3, a masking layer 28 is formed over the fins 14 and the dielectric material 26. The masking layer 28 may include, e.g., a nitride, such as, a silicon nitride. The masking layer 28 is preferably selectively etchable relative to the dielectric material 26 and the fins 14.

Figure 4:
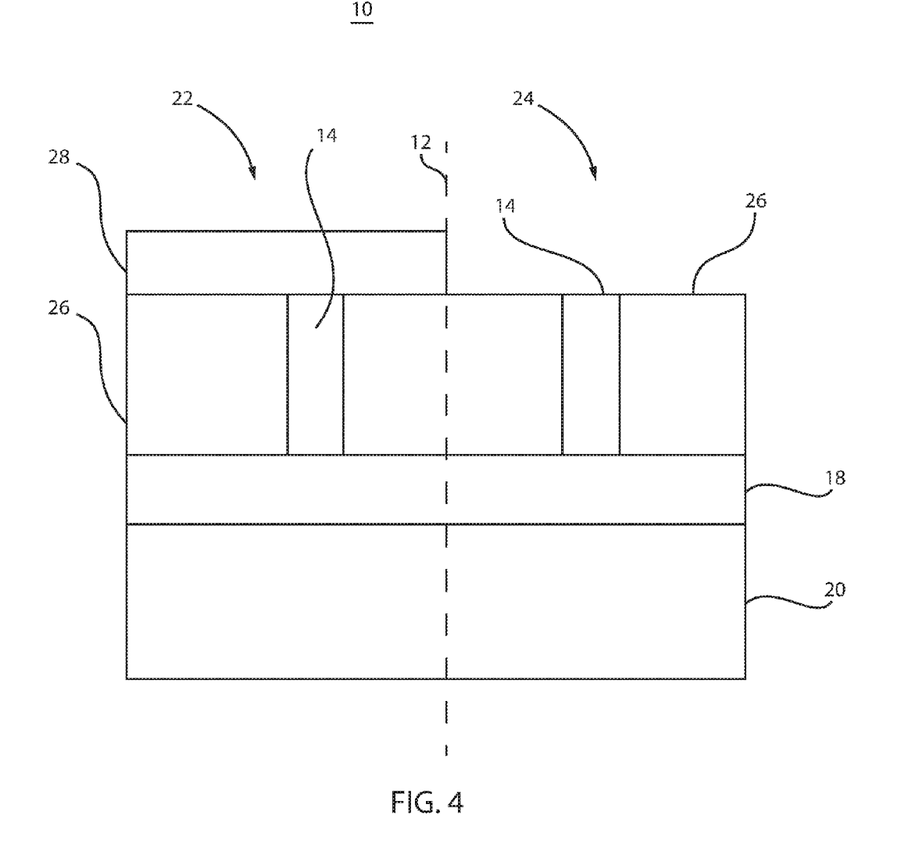
FIG. 4 is a cross-sectional view of the device of FIG. 3 showing the masking layer patterned to cover the first area in accordance with the present principles.

Referring to FIG. 4, a lithographic patterning process is performed to remove the masking layer 28 from the PFET region 24. The lithographic patterning process may include depositing, developing and patterning a photoresist (not shown). The photoresist is then employed to etch the masking layer 28. The etch process may include a reactive ion etch (RIE) process, although other etch processes may be employed.

Figure 5:
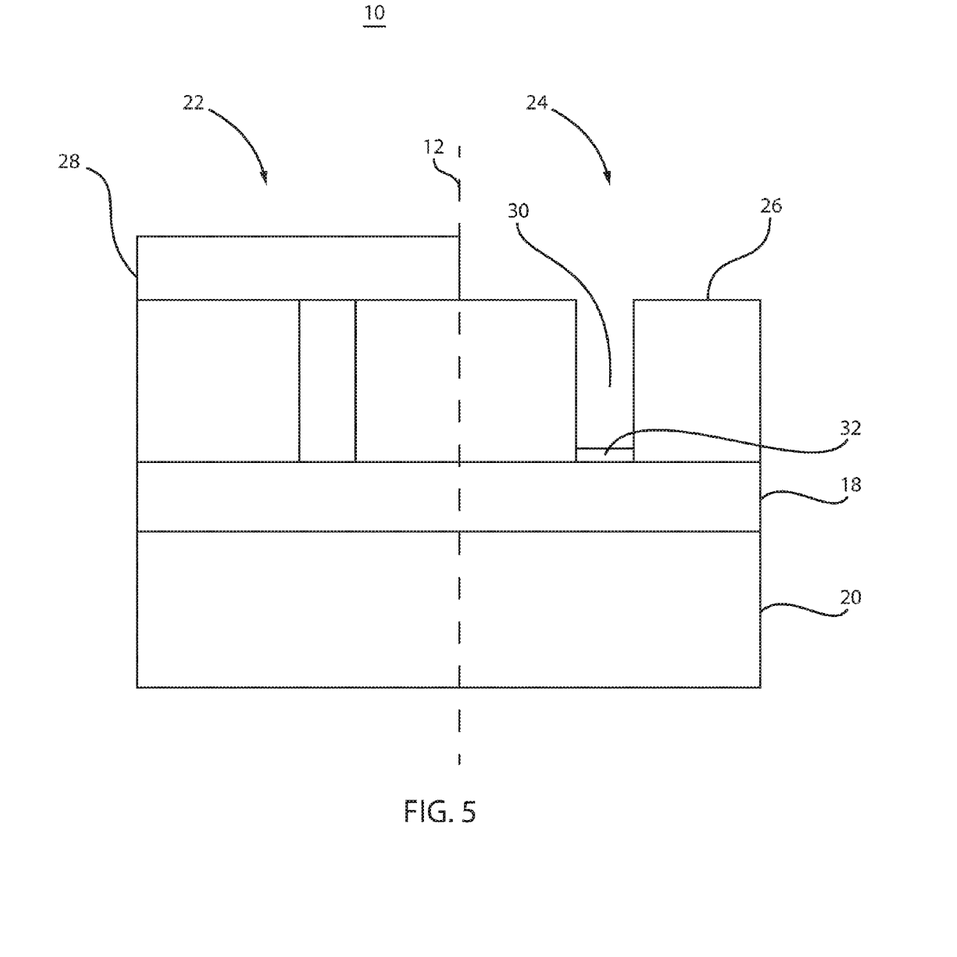
FIG. 5 is a cross-sectional view of the device of FIG. 4 showing the fins in the second area recessed down to a portion and a trench concurrently formed in the dielectric fill in accordance with the present principles.

Referring to FIG. 5, another RIE process is performed to recess the fin 14 in the PFET region 24. The RIE employs an etch chemistry that selectively removes the silicon of the fin 14 in PFET region 24 with respect to the masking layer 28 and the dielectric material 26. The RIE recesses the fin 14 down to a thickness of between about 5 nm to about 10 nm to form a growth layer 32 that will be employed to epitaxially grow SiGe as will be described. Other thickness may also be employed. The RIE process removes a large portion of the fin 14 and concurrently forms a trench 30 within the dielectric material 26. This trench 30 will be employed to confine dimensions of SiGe growth as will be described.

Figure 6:
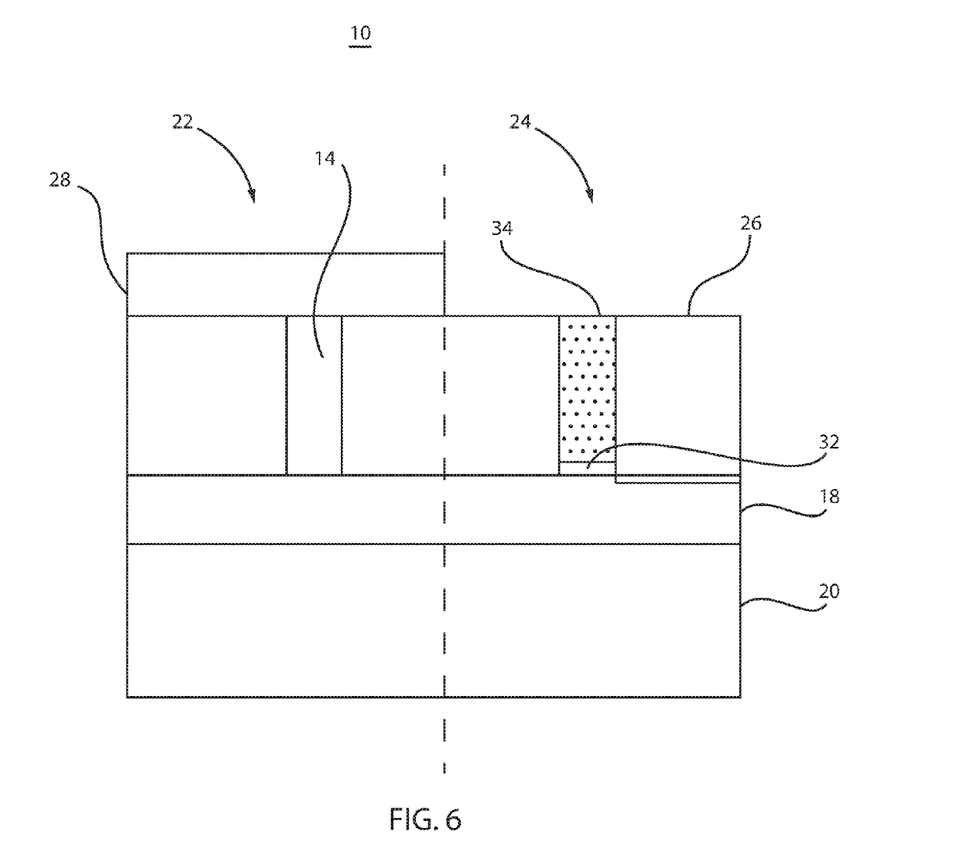
FIG. 6 is a cross-sectional view of the device of FIG. 5 showing the portion employed to grow a SiGe fin in the second area in accordance with the present principles.

Referring to FIG. 6, an epitaxial growth process is performed to grow a fin 34 in the PFET region 24. The growth layer 32 preferably includes a monocrystalline silicon material. The fin 34 preferably includes a SiGe material, and more preferable monocrystalline SiGe. The SiGe material of fin 34 includes compressive strain. However, in contrast to conventional processing, the compressive strain is limited.

In accordance with conventional processing, a large blanket deposition of SiGe limits the size of the layer based upon the critical thickness. The critical thickness depends on the concentration of Ge in the SiGe layer. The blank deposition may include a larger defect density and its thickness is therefore limited.

In accordance with the present principles, the formation process is no longer limited by critical thickness constraints of blanket deposition. Instead, the SiGe of fin 34 is grown within a narrow trench 30, e.g., 20-150 nm in width. The narrow trench 30 helps to limit the strain developed by the SiGe formation. Therefore, the fin 34 may be taller and may include a high concentration of Ge. In one embodiment, the Ge concentration includes from between about 10 atomic % to about 100 atomic %. Since the fin 34 will be employed to form a channel for a fin field effect transistor (finFET), a high concentration of Ge is desirable for PFET devices. In one embodiment, the Ge concentration in fin 34 is about 80 atomic % to 90 atomic %. In some embodiments, the fins 14 and 34 may include a height of greater than about 30 nm and may be about 50 nm or greater.

Once the fin 34 is formed, an anneal or thermal mixing process may be performed to distribute Ge into the growth layer 32 to create a more uniform distribution of Ge. Next, the masking layer is removed from the NFET region 22. Processing continues to form finFETs using known methods.

It should be understood that the fin 14 may be recessed more or less than described. For example, in one embodiment, the fin 14 may be recessed by about half of its original height, although other heights may be employed. In this way, the SiGe growth may include about one half the fin height. The fin may then be annealed or subjected to condensation to mix the fin with Ge. In this case, the Ge concentration would be less than that described above. This may be employed, for example, to include SiGe in the NFET region 22, since NFETs may employ SiGe with a lower amount of Ge, for example, between about 10 atomic % to about 50 atomic % Ge.

In such an embodiment, the masking layer 28 may be employed to recess each fin separately to different heights before epitaxial growth of SiGe in a single process. Other variations are also contemplated.

Figure 7:
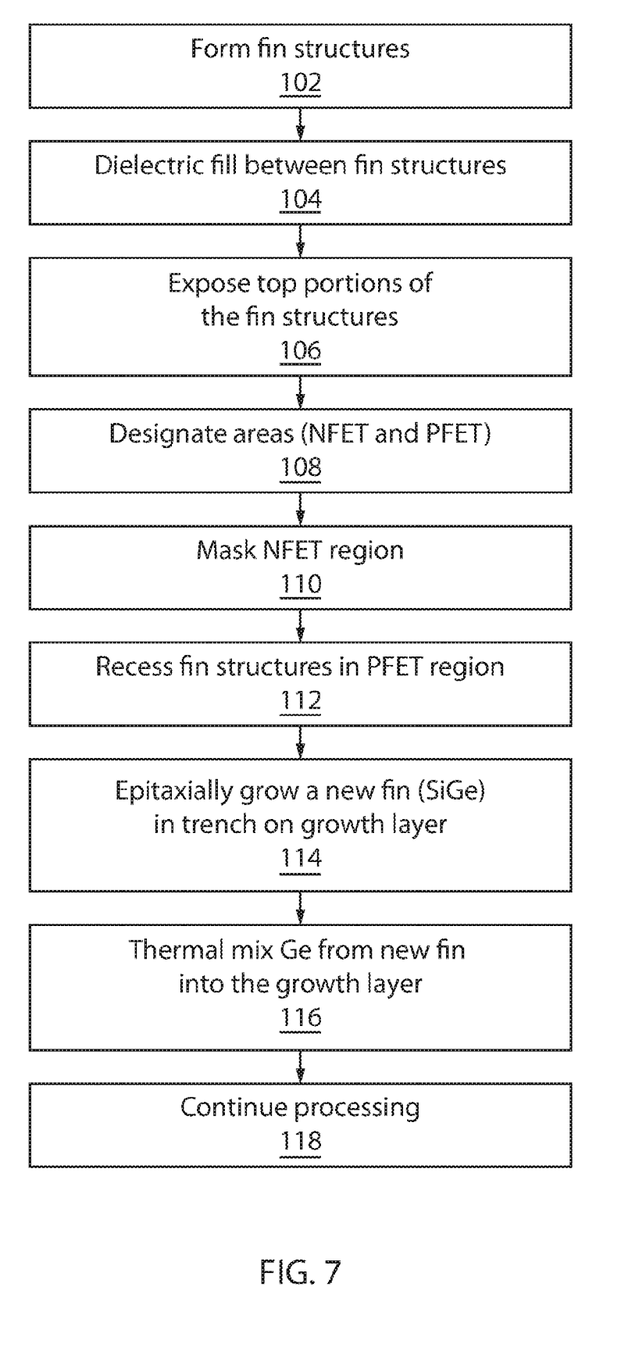
FIG. 7 is a block/flow diagram showing a method for complementary metal oxide semiconductor (CMOS) fin integration in accordance with illustrative embodiments.

Referring to FIG. 7, a method for complementary metal oxide semiconductor (CMOS) fin integration is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fin structures are formed from a silicon layer of a silicon-on-insulator substrate. The fin structures are patterned using lithography or other known processing, e.g., spacer image transfer (SIT), etc. In block 104, a dielectric fill is performed to fill in between the fin structures. In block 106, top portions of the fin structures may be exposed using a CMP or etch process. In block 108, an N-type field effect transistor (NFET) region and a P-type field effect transistor (PFET) region are designated on the substrate. In block 110, the NFET region is masked. The mask may include a masking layer (e.g., silicon nitride) that is deposited and patterned using lithography. In block 112, the fin structures are recessed in the PFET region to form trenches within the dielectric fill. Each trench has a growth layer (silicon portion) remaining at a bottom thereof. The trenches may include a width of between about 20 to 150 nm. The narrow trench limits SiGe growth and therefore is employed to control SiGe strain in the next step. The recessed fin structures may include a height of between about 5 nm to about 10 nm, although other dimensions may be employed.

In block 114, a new fin (e.g., SiGe) is epitaxially grown in the trench from the growth layer (silicon portion). The SiGe growth is independent of Ge concentration therefore high Ge concentration is possible as well as a greater height. The epitaxial growth of the SiGe fin may include a Ge concentration of over 10 atomic %, preferably over 50 atomic % and more preferably over 90 atomic %. The SiGe fin may be grown to a height of at least 30 nm or greater. For example, the fin height may include a dimension of, e.g., 50 nm.

In block 116, Ge from the new fin is thermally mixed into the silicon portion. This may include an anneal process to permit Ge diffusion into the silicon portion. In block 118, processing continues with the formation of finFETs and other structures.

Having described preferred embodiments for CMOS fin integration on SOI substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for complementary metal oxide semiconductor (CMOS) fin integration, comprising:
   recessing a fin structure buried in a dielectric fill to form a trench in the dielectric fill having a fin portion remaining at a bottom thereof;
   epitaxially growing a new fin in the trench from the fin portion, the new fin including SiGe; and
   thermally mixing Ge from the SiGe fin into the fin portion remaining at the bottom of the trench.

2. The method as recited in claim 1, further comprising: masking the fin structure in a first area while leaving top portions of the fin structures in a second area exposed, wherein the first area includes a region for N-type field effect transistors (NFETs) and the second area includes a region for P-type field effect transistors (PFETs).

3. The method as recited in claim 1, wherein epitaxially growing the new fin includes epitaxially growing the new fin with a Ge concentration of over 50 atomic %.

4. The method as recited in claim 1, wherein epitaxially growing the new fin includes epitaxially growing the new fin with a Ge concentration of over 90 atomic %.

5. The method as recited in claim 1, wherein epitaxially growing the new fin includes epitaxially growing the new fin to a height of at least 30 nm.

6. The method as recited in claim 1, wherein recessing the fin structure includes recessing the fin structure to between about 5 nm to about 10 nm in height.

7. The method as recited in claim 1, wherein the trench includes a width of between about 20 nm to about 150 nm.

8. The method as recited in claim 1, further comprising thermally mixing Ge from the new fin into the fin portion.

9. The method as recited in claim 1, wherein the step of epitaxially growing is independent of Ge concentration.

10. A method for complementary metal oxide semiconductor (CMOS) fin integration, comprising:
    forming fin structures from a silicon layer of a silicon-on-insulator substrate;
    forming a dielectric fill between the fin structures;
    exposing top portions of the fin structures by removing a portion of the dielectric fill;
    recessing the fin structures to form trenches within the dielectric fill, each trench having a silicon portion remaining at a bottom thereof;
    epitaxially growing a SiGe fin in the trench from the silicon portion; and
    thermally mixing Ge from the SiGe fin into the silicon portion.

11. The method as recited in claim 10, wherein epitaxially growing the SiGe fin includes epitaxially growing the SiGe fin with a Ge concentration of over 50 atomic %.

12. The method as recited in claim 10, wherein epitaxially growing the SiGe fin includes epitaxially growing the SiGe fin with a Ge concentration of over 90 atomic %.

13. The method as recited in claim 10, wherein epitaxially growing the SiGe fin includes epitaxially growing the SiGe fin to a height of at least 30 nm.

14. The method as recited in claim 10, wherein recessing the fin structures includes recessing the fins to between about 5 nm to about 10 nm in height.

15. The method as recited in claim 10, wherein the trenches include a width of between about 20 nm to about 150 nm.

16. The method as recited in claim 10, wherein the step of epitaxially growing is independent of Ge concentration.

17. The method as recited in claim 10, wherein the SiGe fin is included in a P-type field effect transistor (PFET).

* * * * *